United States Patent [19]

Razin et al.

[11] 4,398,132

[45] Aug. 9, 1983

[54] ELECTRON BEAM CURRENT STABILIZING DEVICE

[76] Inventors: Gennady I. Razin, Kirovsky prospekt, 44/16, kv. 18; Stanislav P. Dmitriev, ulitsa Michurinskaya, 19, kv. 23, both of Leningrad, U.S.S.R.

[21] Appl. No.: 290,801

[22] PCT Filed: Dec. 26, 1979

[86] PCT No.: PCT/SU79/00133
§ 371 Date: Aug. 5, 1981
§ 102(e) Date: Aug. 5, 1981

[87] PCT Pub. No.: WO81/01937
PCT Pub. Date: Jul. 9, 1981

[51] Int. Cl.³ .................................. H05B 7/148
[52] U.S. Cl. ...................................... 315/307; 315/10; 315/101; 315/106
[58] Field of Search ................. 315/10, 101, 106, 107, 315/208, 307, 311; 328/233; 219/121 EA, 121 EB; 250/492.3

[56] References Cited

U.S. PATENT DOCUMENTS 3,293,483  12/1966  Engel .................... 315/10
3,611,017  10/1971  Freeland ............... 315/107 X
3,909,662   9/1975  Thomas et al. .......... 315/307 X

FOREIGN PATENT DOCUMENTS 1339943  12/1973  United Kingdom .

OTHER PUBLICATIONS

Translation of Russian Publication entitled "Beam Control Unit for Charged Particle Accelerator".
Akulov et al., "Industrial Accelerators of Electron Type for Radiative Chemistry", Preprint D-0198, L., SRIEA, 1974, 18p., with ill.

Primary Examiner—Eugene R. La Roche
Attorney, Agent, or Firm—Fleit, Jacobson & Cohn

[57] ABSTRACT

Disclosed is an electron beam current stabilizing device comprising a sensing element (12) responsive to the beam current deviation from the predetermined value, a saw-tooth voltage shaper (14) connected to a high-voltage transformer (2) of an acceleration voltage source and providing periodic saw-tooth voltage, smoothly sloping portions thereof being shaped starting from the moment when the voltage at the high-voltage transformer (2) crosses zero, an adder (13) whose one input is connected to the output of the sensing element (12), and the other input, to the output of the shaper (14), a threshold element (15) connected to the output of the adder (13), a differentiator (16) connected to the output of the threshold element (15) to shape the electric driving pulses when the smoothly sloping portions of the saw-tooth voltage cross at the output of the adder (13) the threshold level of the threshold element (15), a light source connected to the output of the differentiator (16) to convert the electric driving pulses into the light pulses, and a photothyristor (11) controlled by light pulses and inserted into the primary winding of the heater transformer (5) supplied from one of the secondary windings of the high-voltage transformer (2).

4 Claims, 12 Drawing Figures

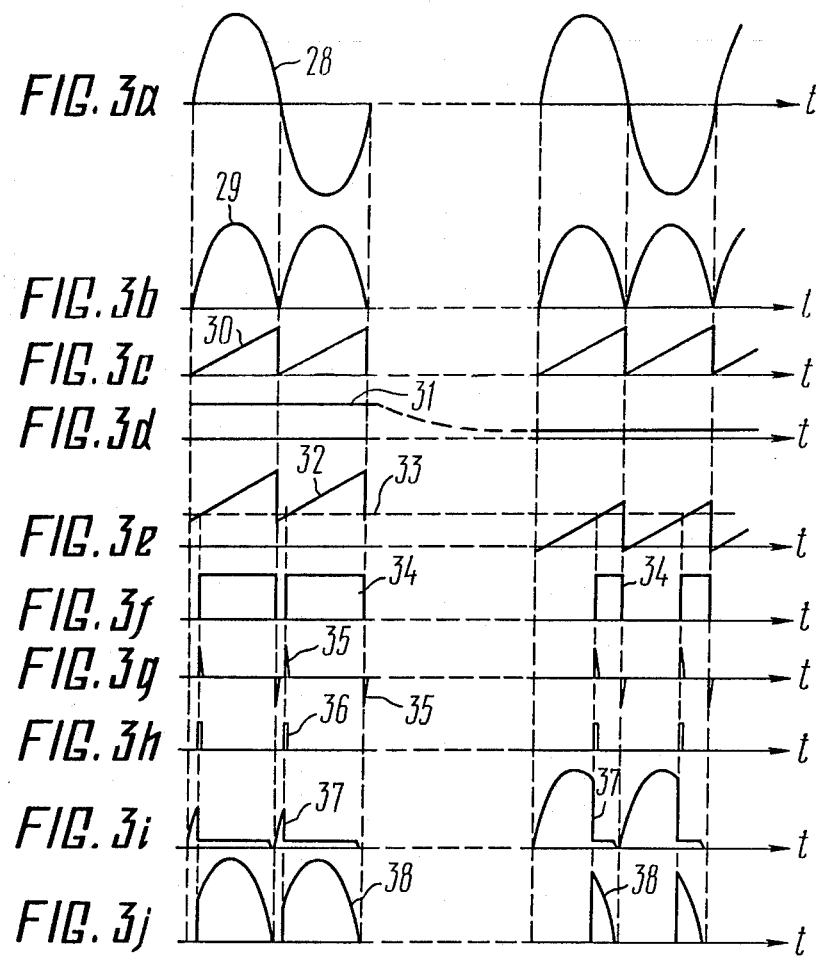

ELECTRON BEAM CURRENT STABILIZING DEVICE

FIELD OF THE INVENTION

The present invention relates to accelerator technique, and more particularly to electron beam current stabilizing devices.

BACKGROUND OF THE INVENTION

It is known that the magnitude of a charged particle beam current in the accelerators designed for industrial application is a basic factor defining the radiation dose value within the accelerator irradiation field. When the material is treated by a charged particle beam, for example, by an electron beam, it acquires certain predetermined properties depending on the radiation dose. Unstability of the radiation dose results in deviation and spread of the properties of the irradiated material from the predetermined specifications. In order to provide the stability of the radiation dose it is very important to stabilize the electron beam current.

The magnitude of the electron beam current is adjusted generally by alteration of the cathode emission current varying either the cathode heater current or the intensity of the electric field around the cathode of the accelerating tube.

Known in the art is an electron beam current stabilizing device (Cf. an article by Akoulov V. V. et al. "Promishlennie uskoriteli serii "Elektron" dlja radiatsionnoi himii", preprint of NIIEFA No. D-0198, Leningrad, 1974, p.II), comprising a ferroresonant voltage regulator connected to a secondary winding of an accelerator high-voltage transformer, designed to supply the accelerating tube cathode heater, and an adjustable autotransformer connected to the output of the ferroresonant regulator. Connected to the output of the autotransformer is a primary winding of the cathode heater transformer, the autotransformer being regulated by means of a reversible electric motor the shaft of which is coupled through an insulating bar with a sliding contact of the autotransformer. The reversible motor is actuated by an operator controlling the magnitude of the electron beam current.

The aforementioned device provides considerably low beam current stability because of, in the first place, low stability of ferroresonant voltage regulators when alteration of the voltage in a supply network occurs, in the second place, the ambiquous relation between the cathode heater voltage and the cathode temperature (the resistance of the heater circuit and herewith the heater current may vary in the course of operation resulting in the alteration of the cathode temperature which brings, in its turn, again to the alteration of the heater circuit resistance etc.) whereas it is known that the cathode emission current depends exactly on the cathode temperature and, in the third place, the loss of emissive properties by the activated cathode due to the aging of said cathode.

Besides, the aforementioned device fails to provide automatic adjustment of the beam current and therefore a considerably large period of time may pass from the moment of alteration of the beam current to the moment of effecting the control, during which the radiation dose will not correspond to a rated value thus leaving a part of the treated material devoid of the required property.

Known in the art is an electron beam current stabilizing device (C.f. Japanese Pat. No. 34514, published in 1974), comprising a thyristor current stabilizer inserted in the cathode heater circuit. The beam current is adjusted in this device, similar to the aforementioned one, by an operator actuating the current stabilizer through insulating bar coupled with the shaft of the reversible electric motor. The device according to this patent provides better stability of the beam current since the heater current and not the heater voltage define the temperature of the cathode and consequenty the beam current. However, the stability of the beam current is still not sufficient due to participation of a man in the process of control.

Also known in the art is an electron beam current stabilizing device (Cf. U.S. Pat. No. 3,293,483 published in 1966), comprising a photosensitive element connected to a cathode of an accelerating tube to adjust the beam current, and a light source controlling this photosensitive element. The photosensitive element is made as a photoresistor. The cathode of the accelerating tube is connected through a secondary winding of the heater transformer and through the photoresistor with a negative output of the acceleration voltage source. The negative output of the acceleration voltage source is also connected to an accelerating tube modulator disposed near the cathode. The primary winding of the heater transformer is connected generally to one of the secondary windings of the high-voltage transformer of the acceleration voltage source.

Means are provided in the device for regulation of the intensity, or brightness, or the spectral composition of the light emanating from the light source, which allow the resistance of the photoresistor to be set such that the potential difference between the cathode and the modulator of the accelerating tube at a given particular value of the acceleration voltage corresponds to the predetermined beam current.

The required beam current value is maintained automatically owing to the fact that when the beam current is deviated from the required value, voltage drops at the photoresistor and therewith the potential difference between the cathode and the modulator is altered, said alteration of the potential difference being characterized by the reduction of said beam current deviation caused by said alteration.

The device according to this patent also fails to provide the sufficient accuracy of stabilization of the electron beam current, which is attributed first of all to the low stability of the intensity and spectral composition of the light radiation as well as to the effect of various interferences upon the transmitted analogue light signal. Unstability of the light radiation results in unstability of the resistance of the photoresistor. Since the light source is not inserted in the control circuit formed by the photoresistor, the cathode of the accelerating tube and the modulator, the regulation error will be proportional to the variation in the parameters of the light source. The accuracy of the beam current stabilization is reduced also because of a considerable temperature unstability of the resistance of the photoresistor approaching about 0.5–3% per a degree whereas the temperature of the accelerator may vary in the course of its operation by as much as 30–40 degrees.

Furthermore the accuracy of stabilization in this device depends on the beam current magnitude and, namely, decreases with the increase in the beam current magnitude, which is explained by the fact that the greater is the portion of the acceleration voltage that drops at the photoresistor, the higher is the accuracy of stabilization. When it is necessary to increase the beam current the operator should decrease the resistance of the photoresistor through changing the light influence, thus decreasing the portion of the acceleration voltage of the photoresistor, the stability of the beam current being consequently lowered.

What is more, the increase in the beam current is accompanied also by additional temperature unstability of the beam current attributed to the heat release at the photoresistor when the beam current flows across it. Thus, for example, to reach the accuracy of stabilization of the order of about several percent, the voltage drop at the photoresistor should be about 2-5% of the acceleration voltage. It does not bring to considerable heating of the photoresistor when the light beam current is equal, for example, to 100 microamperes, since the power released at the photoresistor does not exceed several watts, while the power of about several kilowatts will be released on the photoresistor when the beam current is equal, for example, to 100 milliamperes and the acceleration voltage is equal, for example, to 500 kilovolts. Since heat removal from the high potential area of the accelerator presents difficulties, the photoresistor will be strongly heated whereby its resistance will considerably vary resulting in the alteration of the voltage drop at the photoresistor and therewith the beam current, i.e. in unstability of the beam current.

The device according to the U.S. Pat. No. 3,293,483 cannot be also used for stabilization of heavy beam currents in modern high-power accelerators designed for industrial application because all photoresistors known at present are capable to pass the currents not exceeding several milliamperes, the permissible voltages not exceeding the tens of volts. In modern accelerators maximum beam currents reach hundreds of milliamperes and the potential of the modulator with respect to the cathode may reach several kilovolts. That is why in order to stabilize such beam currents in the aforesaid device at least several hundreds of photoresistors would be required, connected in parallel and in series which, being of considerable dimensions, would occupy a large area under the high potential where the space is extremely limited.

Besides, the device according to the U.S. Pat. No. 3,293,483 is characterized by considerable inertia because of photoresistor inertia, so that the time from the moment of setting the required resistance value of the photoresistor to the moment when the beam current reaches the required value may be long enough, whereby a part of the material being treated is irradiated by a reduced dose and thus becomes rejected.

SUMMARY OF THE INVENTION

The principal object of the present invention is to provide an electron beam current stabilizing device wherein the accuracy of stabilization is increased by eliminating the effect of the alterations of the parameters of the photosensitive element and the light source as well as of the beam current magnitude upon the accuracy of stabilization.

With this principal object in view there is provided an electron beam current stabilizing device for use with an accelerating tube having a heated cathode connected to a heater transformer supplied from one of the secondary windings of the high-voltage transformer of the acceleration voltage source, comprising a photosensitive element connected to the cathode of the accelerating tube to adjust the beam current, and a light source to control the photosensitive element, wherein, according to the invention, the device further comprises a sensing element responsive to the beam current deviation from the predetermined value, a saw-tooth voltage shaper connected to the high-voltage transformer and providing the periodic saw-tooth voltage, shaping of the smoothly sloping portions of which starts at the moments when the voltage at the high-voltage transformer crosses zero, an adder whose one input is connected to the output of the sensing element responsive to the beam current deviation from the predetermined value and whose other input is connected to the output of the saw-tooth voltage shaper, a threshold element, connected to the output of the adder, and a differentiator connected to the output of the threshold element to shape the electric driving pulses when the smoothly sloping portions of the saw-tooth voltage at the output of the adder, cross the threshold level of the threshold element, the light source being connected to the output of the differentiator to convert the electric driving pulses into the light pulses, while the photosensitive element is made as a photothyristor inserted in a primary winding circuit of the heater transformer.

The accuracy of stabilization of the beam current in the proposed device is increased due to the fact that the light source is hooked into the control circuit, acting on the photosensitive element in accordance with the magnitude of the beam current deviation from the predetermined value, detected by the sensing element. The presence of the light source in the control circuit practically excludes the effect of unstability of the parameters thereof upon the accuracy of stabilization.

The use of the photothyristor as a photosensitive element allows to eliminate the effect of unstability of the resistance of the photosensitive element upon the accuracy of the beam current stabilization since the adjustment of the beam current, according to the invention, is carried out not by means of alteration of the resistance of the photosensitive element, but through alteration of the relation of the durations of time intervals corresponding to the cut off and fired state of the photosensitive element.

The proposed device can provide practically any required accuracy of stabilization irrespective of the magnitude of the beam current by means of increasing the transmission factors of the elements constituting the control circuit.

It is reasonable that the threshold level of the threshold element have such a value as to provide, in the absence of the beam current, shaping of the electric driving pulses by differentiator at the moments when the voltage at the photothyristor rises to reach the value allowing, upon firing of the photothyristor, the current equal to the holding current thereof to flow therethrough.

This reduces the time from the moment of switching on of the accelerator to the moment when the beam current reaches the required value.

It is also resonable that the device comprise a diode bridge inserted in the primary winding circuit of the heater transformer and that the photothyristor be inserted in a diagonal of the diode bridge, whereby the supply of the heater transformer by the alternating current free from direct component is provided allowing thus to avoid constant magnetization of the heater transformer core.

The device may comprise a Zener diode connected in series with the photothyristor.

When the Zener diode is used the effect of the time required for regeneration of the photothyristor upon operation of the device is eliminated which allows to apply the device in the accelerators with higher supply frequency.

The following description will be directed to the embodiments according to the present invention by referring to the accompanying drawings.

DESCRIPTION OF THE PREFERRED EMBODIMENTS OF THE INVENTION

Figure 1:
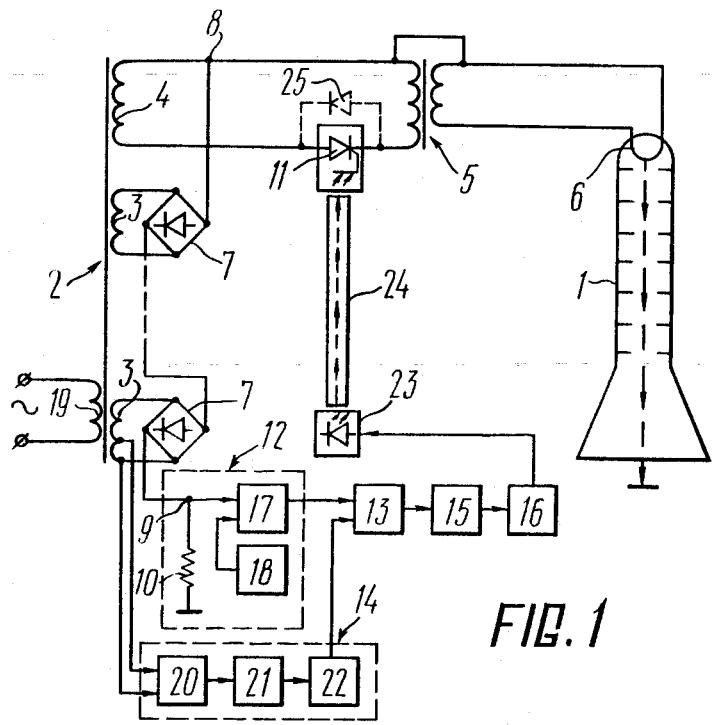
FIG. 1 is a schematic view of an electron beam current stabilizing device, according to the invention.

An electron beam is shaped in an accelerating tube I (FIG. 1) whose accelerating field is produced by an acceleration voltage source comprising a high-voltage transformer 2 having several secondary windings of which the windings 3 are designed to generate the acceleration voltage, and the winding 4 is designed to supply a heater transformer 5 connected to a cathode 6 of the accelerating tube I. Each of the windings 3 is connected to a separate rectifier 7, all the rectfiers 7 being connected in series to obtain the required acceleration voltage.

The cathode 6 of the accelerating tube I is connected electrically with a negative lead 8 of the acceleration voltage source. A positive lead 9 of the acceleration voltage source connected electrically with the last accelerating electrode (not shown) of the accelerating tube I is earthed through a resistor 10 having low resistance and used for measuring the electron beam current.

The beam current is adjusted with the help of a photosensitive element represented, according to the invention, by a photothyristor II inserted in the primary winding circuit of the heater transformer 5. According to the invention, the adjustment of the electron beam current is carried out by alteration of the current of the heater cathode 6 effected through varying the time intervals within the limit of each half-wave of the voltage on the high-voltage transformer 2 during which the photothyristor II is maintained in a conducting state.

According to the invention, the device comprises further a sensing element 12 responsive to the beam current deviation from the predetermined value, an adder 13, a saw-tooth voltage shaper 14, a threshold element 15, a differentiator 16 and a light source to control the conductance of the photothyristor II. The sensing element 12 responsive to the beam current deviation from the predetermined value is provided with a comparison circuit 17 whose one input is connected to the resistor 10 and the other, to the reference voltage source 18. The input of the saw-tooth voltage shaper is connected to the transformer 2, for example, to the low-potential winding 3 of the transformer 2, though it is possible, in principle, to connect the saw-tooth voltage shaper 14 to a primary winding 19 of the transformer 2. However, the connection of the saw-tooth voltage shaper 14 across the secondary winding of the transformer 2 is more preferable due to the fact that this eliminates the effect of phase shift between the primary and the secondary voltages of the transformer 2 occurring when the load of the accelerator is changed.

The saw-tooth voltage shaper 14 comprises, for example, a biphase rectifier 20, a threshold element 21, connected to the output of the rectifier 20, and a saw-tooth voltage generator 22 started by the signals from the output of the threshold element 21. The frequency of the saw-tooth voltage generated by the shaper 14 is twice as that of the voltage at the windings of the transformer 2, the shaping of the smoothly sloping portions of the saw-tooth voltage starting at the moments when the voltage at the windings of the transformer 2 crosses zero.

The output of the sensing element 12 is connected to one of the inputs of the adder 13 the other input of which is connected to the output of the saw-tooth voltage shaper 14, the adder 13 being made either of resistors or on the base of an operational amplifier.

The output of the adder 13 is connected to the input of the threshold element 15 whose threshold level is chosen to be such as to provide in the absence of the beam current the minimum voltage at the output of the adder 13 to be below the threshold level, and the maximum voltage to be above the threshold level.

Connected to the output of the threshold element 15 is the differentiator 16 to shape the electric driving pulses whose shift with respect to the moments when the voltage at the transformer 2 crosses zero is determined by the value and the sign of the beam current deviation from the predetermined value. As it will be shown below in connection with description of the operation of the device, these driving pulses are shaped when the threshold level of the threshold element 15 is crossed by the smoothly sloping portions of the saw-tooth voltage generated at the output of the adder 13, corresponding to the saw-tooth growth, i.e. from the leading edges of the output signal of the threshold element 15. The pulses shaped by the differentiator 16 at the moments when the threshold level is crossed by the steep portions of the saw-tooth voltage at the output of the adder 13, corresponding to the saw-tooth decay, i.e. from the trailing edges of the output signal of the threshold element 15, are not operative pulses and are not used in the device.

Connected to the output of the differentiator 16 is the light source represented by light-emitting diodes 23 and shown in FIG. 1 as one light-emitting diode. The light-emitting diodes 23 convert the electric driving pulses at the output of the differentiator 16 into light pulses firing the photothyristor II, the number of the light-emitting diodes 23 being defined by the intensity of the light flow required to fire the photothyristor II. A flash-lamp or a laser can be also used as the light sources instead of the light-emitting diodes 23.

Light pulses are transmitted from the light-emitting diodes 23 to the photothyristor II through a light pipe 24, for example, a flexible light pipe made of glassfibre or a rod made of organic glass.

According to one embodiment of the present invention the threshold level of the threshold element 15 is such, that in the absence of the beam current the electric driving pulses are shaped by the differentiator 16 at the moments when the voltage at the photothyristor II rises to reach the value at which the current on the photothyristor becomes equal to the holding current thereof. In this case upon switching on of the accelerator when the beam current is zero, the photothyristor II will be conducting practically during the whole half-period of the voltage at the transformer 2, whereby full half-waves of sinusoidal voltage will be applied to the heater transformer 5 and the cathode heater current will have its maximum value exceeding the rated value required to maintain the predetermined beam current. Hence the cathode 6 of the accelerating tube I will be heated quicker than if it were heated by the rated heater current, and the beam current will quicker reach the predetermined value.

According to the embodiment of the present invention shown in FIG. 1, the photothyristor II is inserted directly between the secondary winding 4 of the high-voltage transformer 2 and the primary winding of the heater transformer 5. In this case the photothyristor II will be fired not every half-period of sinusoidal voltage but every second half-period. To provide the heater current flowing every half-period of the sinusoidal voltage, a diode 25, shown in the FIG. 1 by dotted lines, may be inserted in parallel and opposite to the direction of the conductance of the photothyristor II. In both cases, with the diode 25 and without it, the heater transformer 5 will be supplied with the voltage assymetrical with respect to the zero level. It is reasonable to make the core of the transformer 5 split in order to prevent its saturation when it is magnetized by direct component of the heater current.

Figure 2:
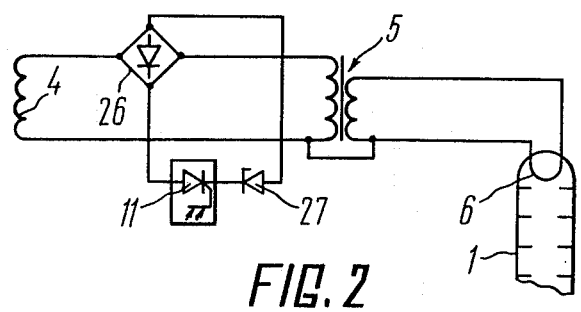
FIG. 2 is another embodiment of connection of a photothyristor to a heater transformer in the device shown in FIG. 1, and FIG. 3a to 3j are time diagrams illustrating operation of the device according to the invention.

According to another embodiment of the present invention, as best shown in FIG. 2, the primary winding of the heater transformer 5 is connected to the winding 4 of the transformer 2 through a diode bridge 26, the photothyristor II being inserted in the diagonal of the diode bridge 26. The diode bridge 26 rectifies the voltage applied to the photothyristor II so that the latter will be fired each half-period of the voltage at the transformer 2 and the heater current will have the shape symmetrical with respect to the zero level.

In case when the supply frequency of the acceleration voltage source is comparatively high, equal, for example, to 400 c.p.s. it may occur that the time interval from the moment of disconnecting of the photothyristor II as a result of the decrease of its current at the end of each half-period of the sinusoidal voltage to the moment of its firing by the light pulse at the beginning of the next half-period will be less than the time required for regeneration of the photothyristor II, this time being not long enough for the photothyristor II to be disconnected, this making it uncontrollable. To prevent this, a Zener diode 27 is inserted in the diagonal of the diode bridge 27 in series with the photothyristor II, the diode 27 having such a stabilization voltage that the voltage at the photothyristor II is absent duting the period equal at least to the period of its regeneration, as a result of which the intervals wherein the photothyristor II is cut off increase. The same effect may be obtained by inserting two oppositely poled Zener diodes in the circuit of the winding 4 of the transformer 2 in series with the diode bridge 26. Since stabilization voltage of the Zener diode is chosen to be many times less than the maximum voltage of the heater supply, its application does not affect much the power consumption.

The device according to the present invention operates as follows.

When the high-voltage transformer 2 (FIG. 1) is connected to the alternating current mains, voltage 28 (FIG. 3a) is produced in its secondary windings 3, which is rectified by the rectifiers 7 and fed to the cathode 6 of the accelerating tube I. The voltage produced on the secondary winding 4 of the transformer 2 is fed through the diode bridge 26 (FIG. 2) and the primary winding of the heater transformer 5 to the photothyristor II. In the absence of the light pulses the photothyristor II is cut off and its voltage has the shape of a rectified sinusoid 29 (FIG. 3b), the voltage in the primary winding of the heater transformer 5 (FIG. 2) and therewith the cathode heater current being zero. Thus the cathode 6 is not heated and does not emit electrons even in the presence of the acceleration voltage.

The voltage from the low-potential winding 3 (FIG. 1) of the transformer 2 is applied to the shaper 14 at the output of which periodic saw-tooth voltage 30 is generated (FIG. 3c) changing in a cophasal way with the rectified sinusoid 29 (FIG. 3b) and having smoothly sloping portions corresponding to the growth of the saw teeth, and steep portions corresponding to the decay of the saw teeth, the saw-tooth voltage being either lineary rising or lineary falling.

The comparison circuit 17 (FIG. 1) produces an error voltage 31 (FIG. 3d) equal to the difference between the reference voltage of the source 18 (FIG. 1) and the voltage produced on the resistor 10 by the load current of the acceleration voltage source equal practically to the beam current. In the absence of the beam current the error voltage 31 has maximum value equal to the reference voltage as shown in the left part of FIG. 3d.

The error voltage 31 is added to the saw-tooth voltage 30 (FIG. 3c) in the adder 13 (FIG. 1) and is applied to the input of the threshold element 15. The voltage at the output of the adder 13 is indicated by numeral 32 and is shown in the FIG. 3e. The threshold element 15 (FIG. 1) responds to the passage of the voltage 32 (FIG. 3e) over the threshold level shown by a dotted line 33, and generates a singal in the form of rectangular pulses (FIG. 3f).

As it was mentioned above in order to accelerate the heating of the cathode 6 (FIG. 1) and hence to reduce the time required for the beam current to reach the predetermined value, the threshold level of the threshold element 15 is chosen such that the smoothly sloping portions of the saw-tooth voltage 32 (FIG. 3e) from the output of the adder 13 (FIG. 1) cross this threshold level at the beginning of each half-period of the sinusoidal voltage 28 (FIG. 3a) when the voltage at the photothyristor II (FIG. 2) reaches the value at which its current is equal to the holding current.

The differentiator 16 (FIG. I) transform the rectangular pulses 34 (FIG. 3f) of the threshold element 15 (FIG. 1) into short pulses 35 (FIG. 3g) which are applied to the light-emitting diodes 23 (FIG. 1). Under the action of the positive pulses 35 (FIG. 3g) formed as a result of differentiation of the leading edges of the pulses 34 (FIG. 3f) of the threshold element 15 (FIG. 1) light-emitting diodes 23 emit light pulses 36 (FIG. 3h) the position of which, taken as a function of time, within each half-period of the sinusoidal voltage 28 (FIG. 3a) brings information about the beam current deviation from the predetermined value. The negative pulses 35 (FIG. 3g) formed from the trailing edges of the pulses 34 (FIG. 3f) of the threshold element 15 (FIG. 1) do not affect the light-emitting diodes 23.

The light pulses 36 (FIG. 3h) fire the photothyristor II (FIG. 2) at the beginning of each half-period of sinusoidal voltage, the photothyristor II remaining conducting practically during the whole half-period of the sinusoidal voltage and is cut off when the current in the primary winding of the heater transformer 5 becomes equal to the holding current of the photothyristor II. When the photothyristor II is fired the voltage therein drops practically to zero and all the voltage generated in the winding 4 of the transformer 2 is found to be applied to the primary winding of the heater transformer 5 (the voltage on the photothyristor II is indicated by the numeral 37 in FIG. 3i). As a result, the heater current 38 (FIG. 3j) flows practically during the whole half-period of the sinusoidal voltage so that the average value of this current is considerably higher than that of the rated heater current required to maintain the predetermined current value. The cathode 6 (FIG. 1) is intensively heated and when a certain temperature is reached it starts to emit electrons shaped by the accelerating tube I into a beam.

The load current of the acceleration voltage source equal practically to the beam current flows through the resistor 10 causing voltage drop thereat. As the load current increases the error voltage 31 (FIG. 3d) decreases reducing consequently the voltage 32 (FIG. 3e) at the output of the adder 13 (FIG. 1) and the moments when this voltage passes over the threshold level 33 (FIG. 3e) of the threshold element 15 (FIG. 1) are displaced to the right relative to the moments when the sinusoidal voltage 28 (FIG. 3e) crosses zero. Consequently the light pulses 36 (FIG. 3h) are also displaced to the right, whereby the photothyristor II is fired later in each half-period of the sinusoidal voltage and the heater current 38 flows only during a part of the half-period of the sinusoidal voltage, as shown in the right side of FIG. 3j, i.e. the average value of the heater current decreases.

Displacement of the light pulses 36 (FIG. 3h) continues until the average value of the heater current 38 (FIG. 3j) reaches the value providing the predetermined beam current.

If in operation of the accelerator the beam current increases and exceeds the predetermined value, the error voltage 31 (FIG. 3d) produced by the sensing element 12 (FIG. 1) will change the sign, and the voltage 32 (FIG. 3e) at the output of the adder 13 (FIG. 1) may decrease to the level when it does not cross the threshold level 33 (FIG. 3e) of the threshold element 15 (FIG. 1). In this case light pulses 36 (FIG. 3h) will not be emitted, the photothyristor II (FIG. 2) remains cut off and the current in the circuit of the heater cathode 6 ceases to flow until the beam current decreases down to the predetermined value.

When the photothyristor II is inserted in the primary winding circuit of the heater transformer 5 without the diode bridge 26, as shown in FIG. 1, the device operates in a similar way except that the photothyristor II is fired during one half-wave in each period of the alternating current voltage.

Commercial applicability

The present invention may be widely used in the electron accelerators designed to irradiate different materials. By increasing the stability of the accelerator beam current the invention provides better stability of the radiation dose and consequently less spread in the properties of the irradiated material. Besides, due to reduction in time required to reach the predetermined value of the beam current the application of the present invention allows to increase the accelerator utilization factor and thereby to increase the efficiency of the accelerator for treatment of the material with the electron beam.

We claim:

1. An electron beam current stabilizing device for use with an accelerating tube having a heater cathode connected to a heater transformer supplied from one of the secondary windings of a high-voltage transformer of an acceleration voltage source, said device comprising a photosensitive element connected to the cathode of the accelerating tube to adjust the beam current, and a light source to control the photosensitive element, characterized in that it further comprises a sensing element (12) responsive to the beam current deviation from the predetermined value, a saw-tooth voltage shaper (14) connected to the high-voltage transformer (2) and providing periodic saw-tooth voltage, smoothly sloping portions thereof being shaped starting from the moment when the voltage at the high-voltage transformer (2) crosses zero an adder (13) whose one input is connected to the output of the sensing element (12) and whose other input is connected to the output of the saw-tooth voltage shaper (14), a threshold element (15) connected to the output of the adder (13), and a differentiator (16) connected to the output of the threshold element (15) to shape the electric driving pulses when the smoothly sloping portions of the saw-tooth voltage cross the threshold level of the threshold element (15) at the output of the adder (13), the light source being connected to the output of the differentiator (16) to convert the electric driving pulses into the light pulses while, the photosensitive element is made as a photothyristor (II) inserted in the primary winding circuit of the heater transformer (5).

2. A device as set forth in claim 1, characterized in that the threshold level of the threshold element (15) has such a value, that in the absence of the beam current, the electric driving pulses are shaped by the differentiator (16) at the moments when the voltage at the photothyristor (II) rises to reach the value allowing, upon firing of the photothyristor (II), the current equal to the holding current thereof to flow therethrough.

3. A device as set forth in claim 1 or 2, characterized in that it comprises a diode bridge (26) inserted in the primary winding circuit of the heater transformer (5), the photothyristor (II) being inserted in the diagonal of the diode bridge (26).

4. A device as set forth in claim 3, characterized in that it comprises a Zener diode (27) connected in series with the photothyristor (II).

* * * * *